United States Patent
Gao

(10) Patent No.: US 11,076,505 B2
(45) Date of Patent: Jul. 27, 2021

(54) COOLING SYSTEM FOR EDGE COMPUTING DEVICE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 46 days.

(21) Appl. No.: 16/714,194

(22) Filed: Dec. 13, 2019

(65) Prior Publication Data

US 2021/0185859 A1 Jun. 17, 2021

(51) Int. Cl.
*H05K 7/20* (2006.01)
*G06F 1/20* (2006.01)

(52) U.S. Cl.
CPC .......... *H05K 7/20663* (2013.01); *G06F 1/20* (2013.01); *H05K 7/207* (2013.01); *H05K 7/20309* (2013.01); *H05K 7/20318* (2013.01); *H05K 7/20327* (2013.01); *H05K 7/20381* (2013.01)

(58) Field of Classification Search
CPC .. G06F 1/20; H05K 7/20309; H05K 7/20319; H05K 7/20327; H05K 7/20381; H05K 7/20663; H05K 7/207
See application file for complete search history.

(56) References Cited

U.S. PATENT DOCUMENTS

| | | | |
|---|---|---|---|
| 7,165,412 B1 * | 1/2007 | Bean, Jr. | F25B 25/005 |
| | | | 165/80.4 |
| 10,856,447 B2 * | 12/2020 | Chen | F28F 3/02 |
| 2017/0064875 A1 * | 3/2017 | Casey | H05K 7/20736 |
| 2017/0363337 A1 * | 12/2017 | Swofford | F25B 49/02 |
| 2018/0066859 A1 * | 3/2018 | Nguyen | F24F 9/00 |
| 2020/0077543 A1 * | 3/2020 | Chen | H05K 7/20172 |
| 2020/0195497 A1 * | 6/2020 | Obaidi | H04L 41/0806 |
| 2020/0241482 A1 * | 7/2020 | Sinha | H04L 67/125 |
| 2020/0386479 A1 * | 12/2020 | Tung | F28F 1/32 |
| 2021/0004265 A1 * | 1/2021 | Guim Bernat | G06N 20/00 |
| 2021/0004344 A1 * | 1/2021 | Cohen | G06N 3/063 |

* cited by examiner

*Primary Examiner* — Jacob R Crum
(74) *Attorney, Agent, or Firm* — Womble Bond Dickinson (US) LLP

(57) ABSTRACT

According to one embodiment, an edge cooling system with an IT container having an edge device partially submerged within a liquid coolant. The device generates heat that is transferred into liquid coolant thereby causing the liquid coolant to vaporize into vapor. The system includes a condenser that condenses vapor into liquid coolant, a vapor buffer configured to buffer and provide vapor to the condenser, a liquid accumulator configured to accumulate condensed liquid coolant and provide liquid coolant to the IT container, a main liquid supply line that couples the condenser and IT container to the liquid accumulator, and a main vapor return line that couples the condenser and IT container to the vapor buffer to create a heat exchanging loop. The system design includes the liquid accumulator and vapor buffer, and functions multiple cooling modes including a supplemental cooling. Each of the components are fully enclosed within an edge container.

20 Claims, 8 Drawing Sheets

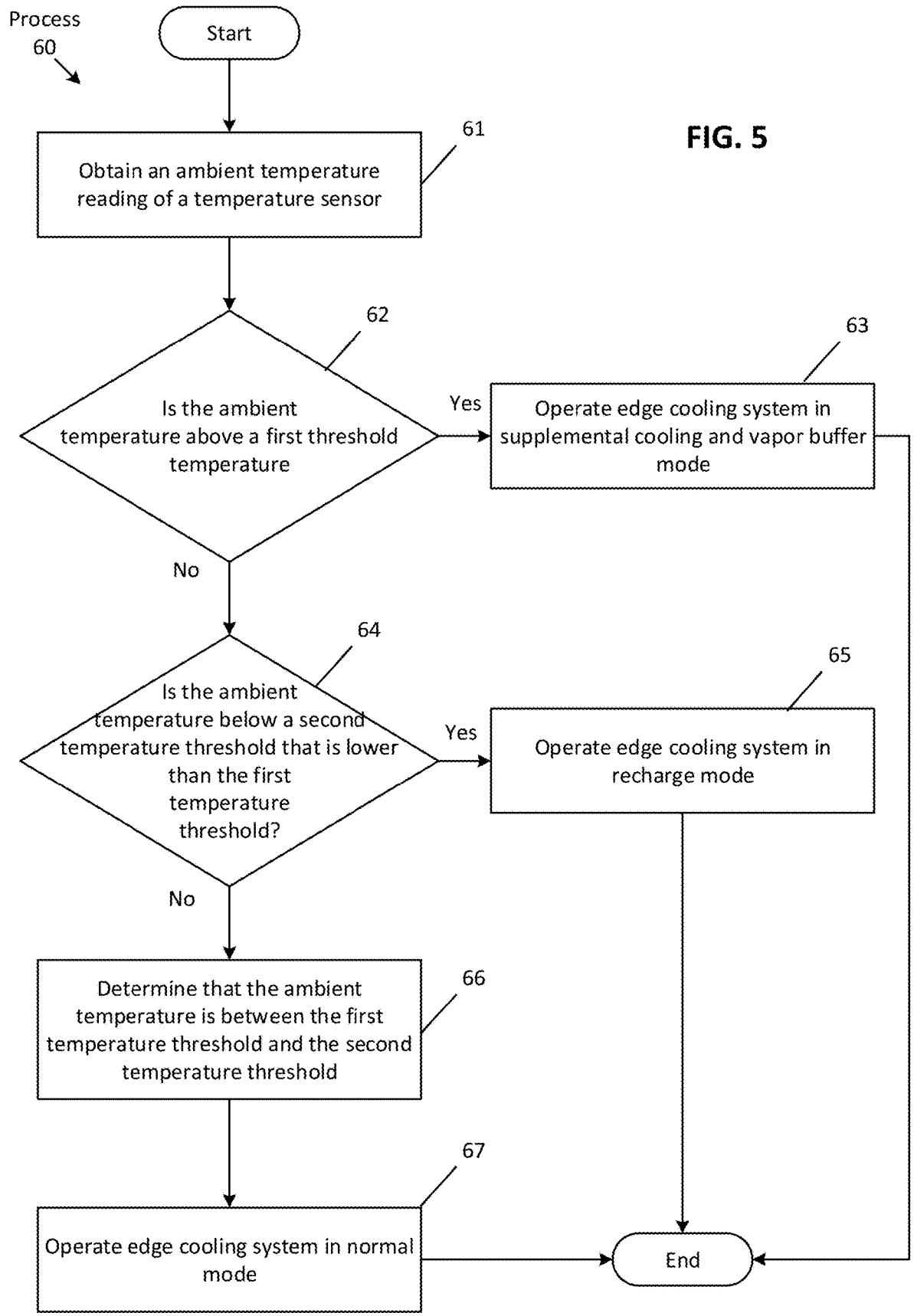

Edge Cooling System Operating in Supplemental Cooling and Vapor Buffer Mode

Edge Cooling System Operating in Normal Mode

COOLING SYSTEM FOR EDGE COMPUTING DEVICE

FIELD

Embodiments of the present disclosure relate generally to a cooling system for an edge computing device or an enclosed electronics package.

BACKGROUND

Today, billions of computing devices are connected to the Internet. As a result, the Internet of Things (IoT) ecosystem is an exponentially growing network of interconnected computing devices. IoT devices can include smart devices, smart vehicles, connected systems etc. using wired or wireless communication over the Internet. Data from the IoT devices can be processed and analyzed in a cloud environment, which can include a data center housing thousands of servers and information technology (IT) equipment for central or core computing. It is not feasible or cost effective, however, to send all data from IoT devices to the cloud for analysis and processing to service IoT devices.

In such an IoT environment, edge computing allows data from IoT devices to be analyzed and processed at the edge or close to the edge before sending data from IoT devices to a data center or cloud environment. This allows edge computing to provide high performance computation, storage and network resources closer to users of IoT devices in order to improve response times and computation performance instead of relying solely on cloud resources, in addition, reduce significant costs for data transferring. As such, edge computing plays an important role for offloading and distributing processing and computing from the cloud having a data center with thousands of information technology (IT) devices and equipment to handle massive amounts of data storage and analysis for IoT devices.

For example, time sensitive applications include artificial intelligence (AI) applications such as autonomous driving (AD). A vehicle with AD driving capabilities requires edge computing because data analysis needs to be implemented in real time without delays or very minimal latency which may occur if all analysis is performed in the cloud. As a result, edge computing for this type of application should be as close as possible to the end user such as in the vehicle providing AD capabilities. As such, the location for edge computing deployment and infrastructure is also critical to handle time sensitive applications for IoT devices.

The environment at locations which edge computing devices are deployed may be different than a data center. In particular, data centers may be designed and controlled to have an optimal environment in which Information Technology (IT) equipment (e.g., servers) operate. For instance, a data center controls and manages the temperature, humidity, flowrate of cooling air and air quality in a data center room at which the IT equipment is deployed. As a result, cooling systems, such as forced air-cooled systems for the IT equipment are designed in light of the data center's environment.

Locations at which edge computing devices are deployed, however, may not have a controlled environment similar to a data center and therefore may not be optimal for cooling systems that are meant to be deployed within data centers. For instance, some locations may be exposed to the ambient outside environment. As a result, these locations may be susceptible to dynamic changes in the ambient temperature and humidity (e.g., based on the time of day and time of year). Also, unlike data centers, some locations may not include air filtration systems and may be susceptible to air pollution that may otherwise adversely affect performance of a cooling system and edge computing device. Therefore, there is a need for an edge cooling system that is able to sufficiently cool an edge computing device regardless of environmental conditions, such as ambient temperature. Also, these systems need to be fully sealed with the edge computing devices in order to protect the devices (and the cooling system) from environment.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIG. 5 is a flow chart of a process for determining what cooling mode an edge cooling system is to operate based on the ambient temperature according to one embodiment.

DETAILED DESCRIPTION

Figure 1:
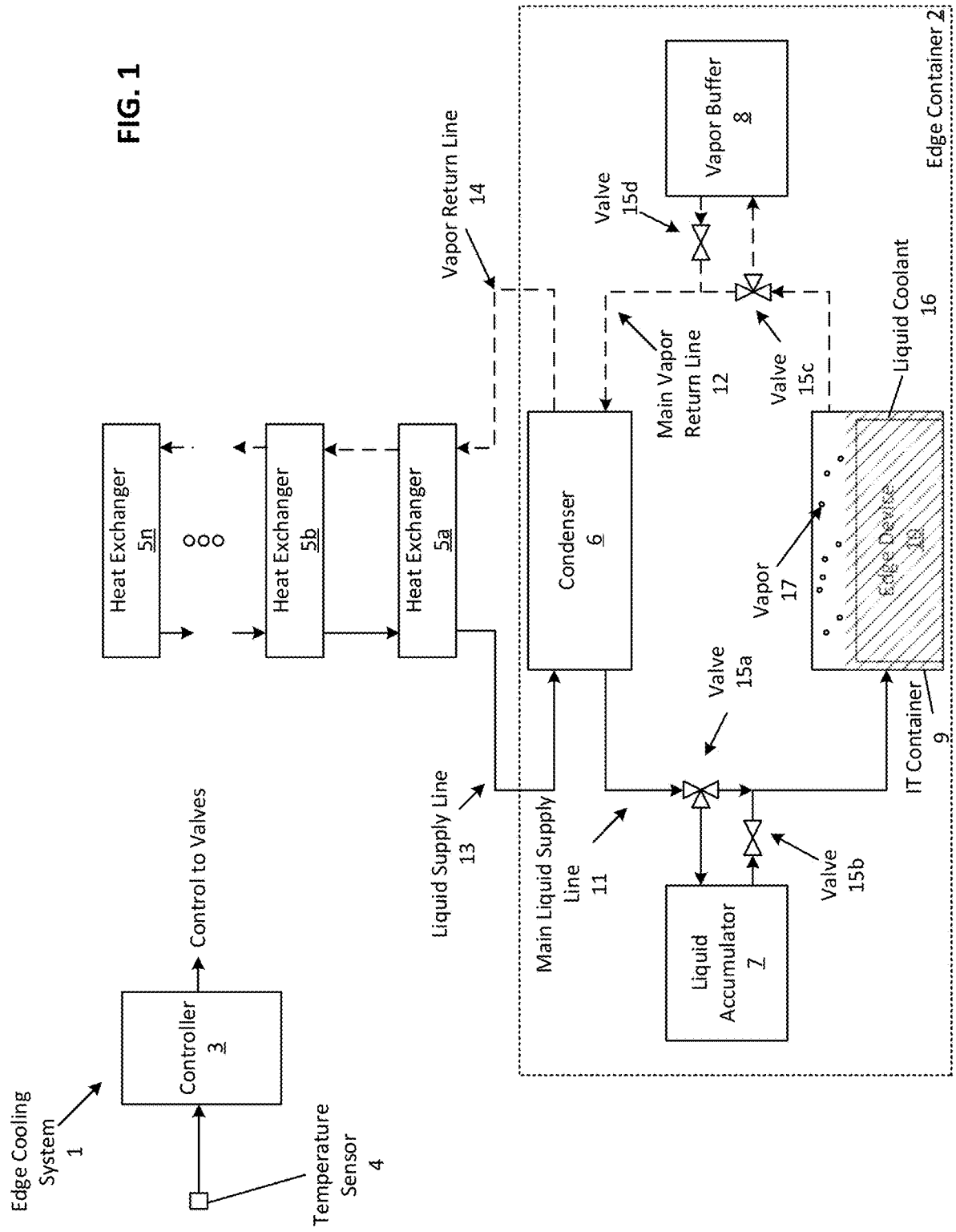
FIG. 1 is a block diagram illustrating an example of an edge cooling system according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Various embodiments of the present disclosure describe a cooling solution design for edge computing devices. The solution uses two-phase changing technologies in designing two heat exchanging loops for moving heat generated by the edge devices to the ambient environment. In particular, this solution is an edge cooling system in which one or more edge devices are at least partially submerged in two-phase liquid coolant having a low boiling point in an IT container that is fully sealed within an edge enclosure (or container). Fluid thermal loops including a supply liquid line and a return vapor line are used within the enclosure to connect the IT container to a condenser in order to create one of the two heat exchanging loops. Also, each of these components may be fully sealed within the enclosure along with the IT container. During operation (e.g., while the edge devices perform data processing services), heat is generated and is extracted by the two-phase liquid coolant. When the temperature reaches its boiling point, the coolant vaporizes into vapor that travels into the condenser via the return vapor line. The condenser is coupled to (via ports on the enclosure) one or more heat exchangers, which are outside of the enclosure, to create the second heat exchanging loop in order to provide cooling to the condenser, thereby allowing the condenser to condense the vapor back into a liquid that is recirculated back into the IT container via the supply liquid line. Thus, the system is able to cool the edge devices, while the first heat exchanging loop is fully sealed within the enclosure and is therefore less susceptible to the ambient environment.

In addition, the edge cooling system is designed to operate in different modes based on various temperature conditions. Specifically, the system also includes a vapor buffer that stores excess vapor and is assembled in parallel to the return vapor line, and a liquid accumulator that accumulates excess liquid coolant and is assembled in parallel to the supply liquid line. The system manages the excess liquid coolant and vapor by using several valves that couple to the liquid supply line and vapor return line. Depending upon the ambient temperature, the system will operate in one of several modes in which the valves are controlled to adjust the flow of liquid coolant within the liquid supply line and adjust the flow of vapor within the vapor return line. Thus, the system is able to operate in any environment by a proper design (e.g., when the buffering system is large enough, the system is able to operate in any environment) and is able to maintain peak performance during changes in the environment.

An embodiment of the present disclosure solves the problem of deploying and cooling edge computing devices (or edge devices) in different environments. Specifically, unlike being deployed in a data center that has a controlled environment (e.g., controlled temperature, humidity, air quality, etc.), edge devices may need to be deployed in an outside environment that is directly exposed to outside (or ambient) air and is therefore not as effectively controlled as the data center. Deployment of such devices in the outside environment includes many challenges, such as ensuring sufficient cooling at all times given changes in the temperature in the environment and ensuring air quality does not impact the long term reliability of the edge device.

The solution proposed in the current disclosure provides an edge cooling system that includes an IT container having an edge device that is at least partially submerged within a liquid coolant, a condenser, a vapor buffer, a liquid accumulator, a main liquid supply line that circulates liquid coolant and couples the condenser, the IT container, and the liquid accumulator together, and a main vapor return line that circulates liquid coolant vaporized by the IT container and couples the condenser, the IT container, and vapor buffer together, all of which are fully enclosed within an edge container. Coupled to the condenser are one or more heat exchangers that draw heat away from the condenser and into the outside environment. Thus, the heat exchanging loop that draws heat out of the edge device is contained within a fully enclosed environment, thereby protecting the components from the outside environment. The system also includes several valves that control the flow of liquid coolant and vapor within the system in response to the ambient temperature. As a result, the system is able to efficiently cool the edge devices to meet the dynamic temperature changes of the outside environment.

According to one embodiment, an edge cooling system that includes an Information Technology (IT) container having an edge device that is configured to provide IT services and is at least partially submerged within a liquid coolant, where, while the edge device provides the IT services, the edge device generates heat that is transferred into the liquid coolant thereby causing at least some of the liquid coolant to turn into a vapor. The system also includes a condenser that is configured to condense vapor back into liquid coolant, a vapor buffer that is configured to at least one of buffer the vapor or provide buffered vapor to the condenser, a liquid accumulator that is configured to at least one of accumulate the liquid coolant condensed by the condenser or provide the accumulated liquid coolant to the IT container, a main liquid supply line that couples the condenser and the IT container to the liquid accumulator and a main vapor return line that couples the condenser and the IT container to the vapor buffer to create a heat exchanging loop, and an edge container in which the IT container, the vapor buffer, the condenser, the liquid accumulator, the main liquid supply line, and the main vapor return line are fully enclosed therein.

In one embodiment, the heat exchanging loop is a first heat exchanging loop, where the edge cooling system further includes a heat exchanger that is coupled to the condenser via a liquid supply line and a vapor return line to create a second heat exchanging loop. In another embodiment, the edge container includes a main supply port and a main return port that are both coupled to the condenser, where the main supply port and the main return port each have a dripless quick disconnect that is configured to removably couple to the liquid supply line and vapor return line, respectively. In some embodiments, the liquid coolant is a first liquid coolant and the vapor is a first vapor, where the liquid supply line is configured to provide a second liquid coolant from the heat exchanger to the condenser and the vapor return line is configured to provide a second vapor from the condenser to the heat exchanger that is produced when the condenser transfers heat contained within the vapor in the first heat exchanging loop into the second liquid coolant, where the heat exchanger has a cooling coil that is configured to condense the second vapor in the second heat exchanging loop into the second liquid coolant, and one or more fans that is configured to move ambient air over the cooling coil. In another embodiment, the heat exchanger is a first heat exchanger that includes 1) a supply port and a return port that are each configured to removably couple to the liquid supply line and vapor return line, respectively and 2) an extension supply port and an extension return port that are both configured to removably couple to a second heat exchanger via an extension liquid supply line and an extension vapor return line, respectively, to extend the second heat exchanging loop to include both the first and second heat exchangers. In another embodiment, the heat exchanger and the edge container are one integrated unit.

In one embodiment, the main liquid supply line includes a first three-way valve that is coupled between the condenser, the liquid accumulator, and the IT container and a first two-way valve that is coupled between the liquid accumulator and the IT container, and the main vapor return line includes a second three-way valve that is coupled between the IT container, the vapor buffer, and the condenser and a second two-way valve that is coupled between the vapor buffer and the condenser. In some embodiments, the edge cooling system further includes a temperature sensor that is configured to sense an ambient temperature and produce a signal that represents the ambient temperature and a controller that is communicatively coupled to the temperature sensor and is configured to control an opening ratio of the valves based on the ambient temperature measured and processed by the temperature sensor.

In one embodiment, when the ambient temperature is above a temperature threshold, the controller is configured to 1) open the first three-way valve to only allow liquid coolant to flow from the condenser into the liquid accumulator, 2) open the first two-way valve to allow liquid coolant to flow from the liquid accumulator into the IT container, 3) open the second three-way valve to allow vapor to travel from the IT container into the vapor buffer and the condenser, and 4) close the second two-way valve.

In one embodiment, where the temperature threshold is a first temperature threshold, where, when the ambient temperature is below a second temperature threshold that is lower than the first temperature threshold, the controller is configured to 1) open the first three-way valve to allow liquid coolant to flow from the condenser into the liquid accumulator and the IT container, 2) close the first two-way valve, 3) open the second three-way valve to only allow vapor to travel from the IT container into the condenser, and 4) open the second two-way valve to allow vapor to travel from the vapor buffer into the condenser.

In another embodiment, when the ambient temperature is between the first and second temperature threshold, the controller is configured to 1) open the first three-way valve to only allow liquid coolant to flow from the condenser into the IT container, 2) close the first two-way valve, 3) open the second three-way valve to only allow vapor to travel from the IT container into the condenser, and 4) close the second two-way valve.

According to one embodiment, an edge cabinet that includes an edge container that has enclosed therein, the IT container, the condenser, the vapor buffer, the liquid accumulator, the main liquid supply line, and the main vapor return line as previously described. In one embodiment, the edge cabinet further includes one or more slots that are each configured to house at least one heat exchanger that is configured to couple to the condenser to create a second heat exchanging loop as previously described. In some embodiments, the edge cabinet further includes a temperature sensor and a controller as previously described.

FIG. 1 is a block diagram illustrating an example of an edge cooling system according to one embodiment. Specifically, this figure illustrates a block diagram of an edge cooling system 1 that includes a temperature sensor 4, a controller 3, one or more heat exchangers 5a-5n, a condenser 6, an IT container 9, a liquid accumulator 7, a vapor buffer 8, a main liquid supply line 11, a main vapor return line 12, a liquid supply line 13, and a vapor return line 14. In one embodiment, the system may include more or less elements (or components) as described herein. For example, the system may include more than one liquid accumulator and/or vapor buffer.

In one embodiment, at least some of the components described herein are enclosed within an edge container 2. As illustrated, the condenser 6, the liquid accumulator 7, the vapor buffer 8, the IT container 9, the main liquid supply line 11, and the main vapor return line 12 are fully enclosed within the edge container. For instance, the container may seal the components from the outside environment, thereby creating a closed heat exchanging loop. As described herein, the container may include at least two ports that enable the liquid supply line 13 and the vapor return line 14 to couple to the condenser 6. In one embodiment, the edge container may include other components, such as the controller 3. In another embodiment, the temperature sensor 4 may be positioned outside the edge container 2 (e.g., coupled to a surface of the edge container). More about the edge container is described herein.

The IT container 9 includes an edge device 10 that is at least partially submerged within a liquid coolant 16. In one embodiment, the container may include several (e.g., one or more) edge devices, each of which is configured to provide IT services (e.g., cloud-based storage services, image processing, deep data learning algorithms or modeling, etc.). Specifically, the edge device may include any number of computing devices, e.g., blade servers, that may be deployed at a close location to Internet of Things (IoT) devices (not shown) in comparison to cloud computing (e.g., performed by pieces of IT equipment that are deployed in a centralized data center). Examples of IoT devices may include smart phones, smart home devices, autonomous cars or vehicles, smart factor devices or sensors, smart city devices including traffic lights, smart hospital devices, bank/financial institution devices, school devices, etc. As a result, data exchange and transfer can be faster with lower cost by having the edge device closer to IoT devices as opposed to having the operations be performed by the centralized data center.

In another embodiment, the IT container 9 may include a battery backup unit (BBU) that is configured to provide battery backup power (e.g., to one or more edge devices), when a (e.g., alternating current (AC) mains) power supply is unavailable (e.g., during a power outage).

In one embodiment, the liquid coolant 16 may be any type of thermally conductive dielectric liquid. In another embodiment, the coolant may be a non-toxic fluid. In some embodiments, the liquid coolant may be designed and operated to have a low boiling point (e.g., below a threshold operating temperature for the edge device 10).

In one embodiment, the edge device 10 is configured to generate heat while providing IT services. This heat is transferred into the liquid coolant 16 thereby causing at least some of the liquid coolant to turn (e.g., vaporize) into a (first) vapor 17, which may collect inside the IT container 9 (e.g., above a top level of the liquid coolant). In one embodiment, the edge device 10 and liquid coolant 16 (and collected vapor 17) are enclosed (e.g., sealed within) the IT container in order to prevent fluids (e.g., the liquid coolant and/or vapor) from escaping into the environment.

As illustrated, the main vapor return line 12 couples the IT container 9 to (e.g., a vapor input of) the condenser 6. In one embodiment, to "couple" refers to fluidly coupling at least two components together in order to allow fluid (e.g., vapor 17 and/or liquid coolant 16) to flow from one component to another. In this case, the line 12 is configured to allow vapor to travel from the IT container to the condenser (or in other words is configured to provide the vapor 17 produced in the IT container to the condenser). The main vapor return line 12 is also coupling the condenser and the IT container to the vapor buffer 8 that is configured to buffer (or store) the vapor 17 that is vaporized from liquid coolant 16 in the IT container. In one embodiment, the buffer 8 is also configured to provide the vapor buffered in the buffer to the condenser 6. In one embodiment, the vapor buffer is in parallel to the main vapor return line 12, such that the return line 12 is coupled to an input of the vapor buffer and is coupled to an output of the vapor buffer. More about how the vapor buffer is configured to buffer and provide vapor is described herein.

The main liquid supply line 11 couples the IT container 9 to (e.g., a liquid output of) the condenser 6. Similar to the main vapor return line 12, the main liquid supply line 11 is configured to allow liquid coolant condensed from vapor 17 by the condenser 6 to flow from the condenser into the IT container. The main liquid supply line is also coupling the condenser and the IT container to the liquid accumulator 7 that is configured to at least one of accumulate the liquid coolant condensed by the condenser or provide the accumulated liquid coolant to the IT container. Similar to the vapor buffer, the liquid accumulator is in parallel to the main liquid supply line 11, such that the supply line 11 is coupled to an input of the liquid accumulator and is coupled to an output of the liquid accumulator. More about how the liquid accumulator accumulates and provides liquid coolant is described herein.

The condenser 6 is a two-phase liquid-to-liquid heat exchanger that is configured to condense vapor 17 into a cooled (condensed) liquid coolant 16. As described herein, the main liquid supply line 11 couples the condenser 6 and the IT container 9 to the liquid accumulator 7 and the main vapor return line 12 couples the condenser and the IT container to the vapor buffer 8 to create a (first) heat exchanging loop. In addition, the condenser is coupled to one or more heat exchangers 5a-5n via a liquid supply line 13 and a vapor return line 14 to create another (a second) heat exchanging loop. During operation (e.g., while the edge device 10 provides IT services) vapor 17 is produced and is provided by the main vapor return line 12 to the condenser. A (second) liquid coolant (e.g., liquid coolant 29 illustrated in FIG. 2) is provided by the heat exchanger(s) via the liquid supply line 13 (via a liquid input) into the condenser. The heat from the vapor in the first heat exchanging loop is transferred into the second liquid coolant and vaporizes the second liquid coolant into a (second) vapor (e.g., vapor 28 illustrated in FIG. 2). For instance, the condenser may include a coil that is coupled between the main vapor return line 12 and the main liquid supply line 11. The second liquid coolant may come into contact with the coil, drawing the latent heat contained within the vapor 17 and thereby condensing the vapor into the liquid coolant 16. In one embodiment, the second liquid coolant within the second heat exchanging loop has a lower boiling point than the first liquid coolant 16 within the first heat exchanging loop. The condensed liquid coolant is provided by the main liquid supply line 11 (that is coupled to a liquid output of the condenser) into the IT container. As described herein, the transfer of heat causes the second liquid coolant to vaporize into the second vapor that is provided to the one or more heat exchangers via the vapor return line 14 (that is coupled to a vapor output of the condenser), which the heat exchangers then condense back into the second liquid coolant.

In one embodiment, the lines that are configured to provide vapor (e.g., main vapor return line 12 and vapor return line 14) may be different than lines that are configured to provide liquid coolant (e.g., main liquid supply line 11 and liquid supply line 13). For example, vapor lines may have a diameter that is larger than a diameter of liquid lines. In one embodiment, any of the lines (vapor and liquid) may be composed of any material. For example, the lines may be composed of metal, such as copper, a polymer (e.g., an EPDM rubber), and/or plastic. In one embodiment, the lines may be composed of a flexible material such as rubber.

In one embodiment, the heat exchangers 5a-5n may be any type of two-phase heat exchangers that are configured to condense vapor into liquid. For example, the heat exchangers may be forced air-cooled heat exchangers that are configured to transfer heat contained within the vapor received from the condenser 6 into (e.g., ambient) air, thereby causing the vapor to condense (and cool) into liquid coolant. As another example, the heat exchangers may be liquid-to-liquid heat exchangers that are configured to transfer the heat from the vapor into a (third) liquid coolant that is provided to an external cooling source (e.g., an IT liquid cooling water system or any type of cooling fluid source). In one embodiment, the heat exchangers 5a-5n may include any combination of heat exchangers (e.g., some being forced air-cooled, while others are liquid-to-liquid). In one embodiment, the heat exchangers (more particularly heat exchanger 5a) may be configured to removably couple to the edge container. In another embodiment, one or more heat exchangers (e.g., 5a and 5b) may be a part of or fixedly coupled to the edge container 2. Specifically, the heat exchangers 5a and 5b and the edge container 2 may be integrated as one unit. As described herein, although the two heat exchangers may be integrated with the edge container, additional heat exchangers (e.g., 5n) may be coupled to the heat exchangers (e.g., 5b) in order to increase the cooling system's cooling capacity. More about the heat exchangers 5a-5n is described herein.

As described herein, the edge cooling system 1 is configured to dynamically operate (e.g., providing a cooling solution) to one or more edge devices 10 in various environments and under changing conditions within the environments (e.g., changing temperature, humidity, etc.). To do this, the system is configured to dynamically change opening ratios of one or more valves within the main liquid supply line 11 and/or the main vapor return line 12 in order to adjust the flow of vapor 17 and/or liquid coolant 16 that are each circulating within the first heat exchanging loop. For instance, the main liquid supply line includes a (first) three-way valve 15a that is coupled between the condenser 6, the (input of the) liquid accumulator 7, and the IT container 9, and includes a (first) two-way valve 15b that is coupled between the (output of the) liquid accumulator and the IT container. The valve 15a is configured to operate in one of at least four positions: a first open position in which liquid coolant flows from the condenser into (an input of) the liquid accumulator, a second open position in which liquid coolant flows from the condenser into the IT container, and a third open position in which liquid coolant flows from the condenser into the liquid accumulator and the IT container, and a closed position in which liquid coolant is not allowed to flow from the condenser into either of the liquid accumulator or the IT container. The valve 15b is configured to operate in one of at least two positions: an open position in which liquid coolant flows from (an output of) the liquid accumulator to the IT container and a closed position in which liquid coolant from the liquid accumulator is not allowed to flow into the IT container.

Similar to the main liquid supply line 11, the main vapor return line 12 includes a (second) three-way valve 15c that is coupled between the IT container 9, the (input of the) vapor buffer 8, and the condenser 6, and includes a (second) two-way valve 15d that is coupled between the (output of the) vapor buffer and the condenser. The valve 15c is configured to operate in one of at least four positions: a first open position in which vapor 17 flows from the IT container into the condenser, a second open position in which vapor flows from the IT container into the condenser, a third open position in which vapor flows from the IT container into the condenser and the vapor buffer, and a closed position in which vapor is not allowed to flow from the IT container into either the condenser or the vapor buffer. The valve 15d is configured to operate in one of at least two positions: an open position in which vapor flows from the vapor buffer into the condenser and a closed position in which vapor is not allowed to flow from the vapor buffer into the condenser. In one embodiment, a valve that is in an open position may be a valve that is fully open or is at least partially open (e.g., with an opening ratio of 50%). More about opening/closing the valves is described herein.

In one embodiment, any of the valves may be any combination of two or three-way valves. For instance, rather than valve 15a being a three-way valve, the main liquid supply line 11 may include two two-way valves that operate independently in order to allow liquid coolant to flow to the liquid accumulator 7, the IT container, or a combination thereof.

The temperature sensor 4 is configured to sense an ambient temperature (e.g., a temperature of the outside environment with respect to the edge container 2) and produce a signal that represents the ambient temperature. In one embodiment, the temperature sensor may be any type of temperature sensor (e.g., thermocouple, Resistance Temperature Detector (RTD), etc.) that is configured to sensor or measure temperature as a signal. In one embodiment, the temperature sensor may be a part of the edge container 2 or at least one of the heat exchangers 5a-5n. In another embodiment, the temperature sensor may be a part of a separate electronic device (not shown).

The controller 3 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the edge container 2. In another embodiment, the controller may be a part of (or one of) the edge devices 10 within the IT container 9.

In one embodiment, the controller 3 is communicatively coupled (e.g., wired and/or wirelessly connected) to the valves 15a-15d and/or the temperature sensor 4. Specifically, the controller is configured to receive an ambient temperature reading (as an electrical signal) from the sensor 4 and to control at least one of the valves (e.g., by transmitting a control signal to control circuitry of the valve, such as an electronic switch) in order to adjust an opening ratio (or position) of the valve (e.g., to at least partially open the valve, open the valve all the way, or close the valve) as described herein. More about how the controller controls the valves is described herein.

Figure 2:
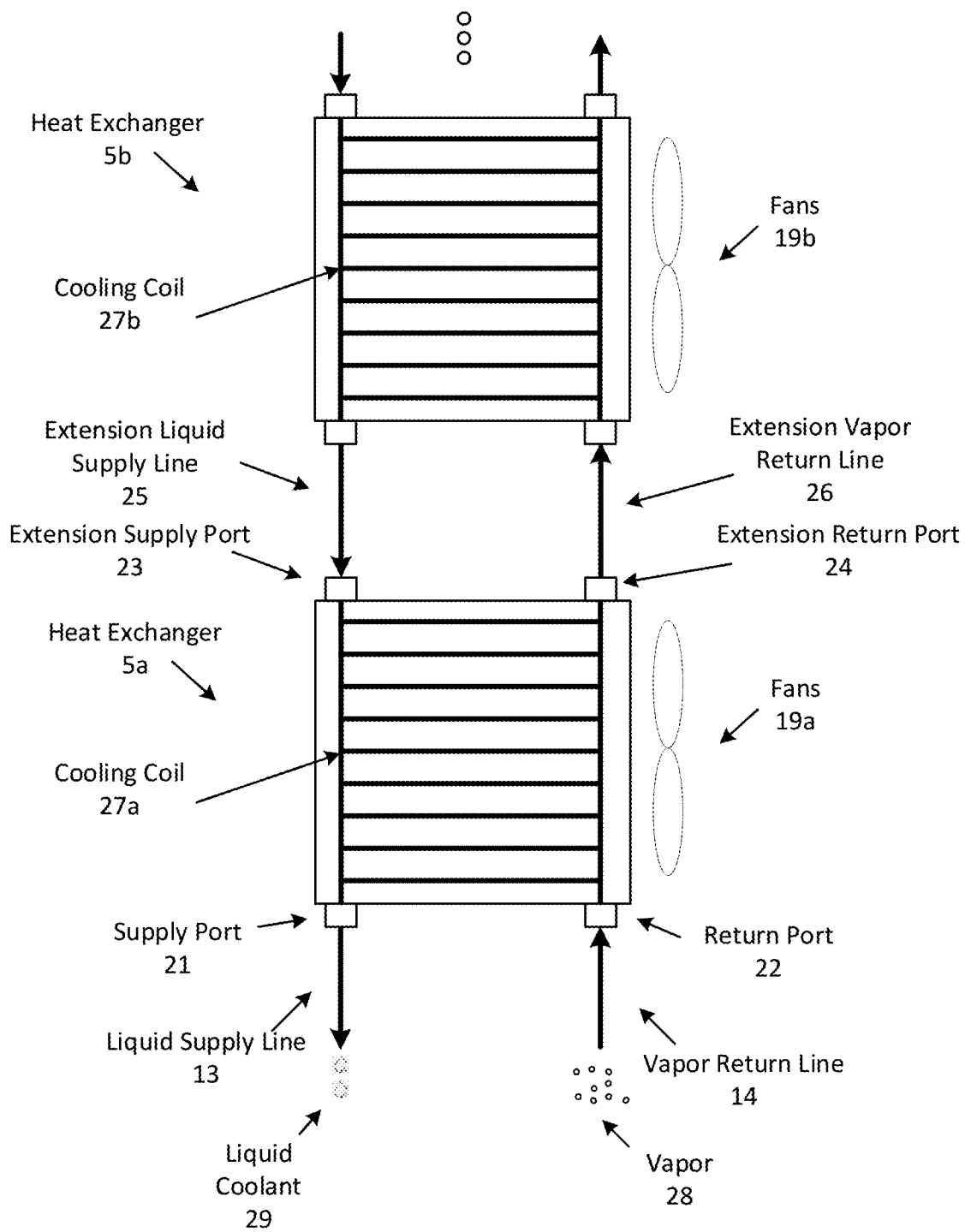
FIG. 2 is a block diagram illustrating an example of several heat exchangers of the edge cooling system according to one embodiment.

FIG. 2 is a block diagram illustrating an example of several heat exchangers of the edge cooling system according to one embodiment. Specifically, this figure illustrates two heat exchangers 5a and 5b that are coupled in parallel with one another in order to increase the cooling capacity (e.g., heat transfer cooling surface area) of the second heat exchange loop of the edge cooling system 1 of FIG. 1. In one embodiment, heat exchangers may be coupled in parallel and/or in series with one another and/or with the condenser 6. In one embodiment, more or less heat exchangers may be coupled to one another. Each heat exchanger may include one or more fans 19, which may be a part of the heat exchangers (e.g., fans 19a being a part of exchanger 5a). As another example, the fans may be a part of an air cooling system that are coupled to an air inlet of the heat exchanger via an air duct (not shown).

As illustrated both heat exchangers are two-phase air-to-liquid heat exchangers that include ports to couple to the condenser 6 (or another heat exchanger) and extension ports that enable heat exchangers to be added/removed to the second heat exchanging loop. In one embodiment, the ports may include connectors that enable lines to be removably coupled to ports. In another embodiment, the connectors may be dripless blind matting quick disconnects (or dripless quick disconnects). For example, the ports may have male type connectors (e.g., supply port 21), while a line includes a female type connector (e.g., liquid supply line 13) that enables a technician to couple the line to the port. In one embodiment, each of the heat exchangers also includes a cooling coil 27 that is configured to draw heat from vapor to condense the vapor back into liquid coolant. More about how the cooling coil condenses is described herein.

As illustrated, the heat exchanger 5a includes supply port 21 that is configured to removably couple to the liquid supply line 13 and return port 22 that is configured to removably couple to the vapor return line 14. In addition, the heat exchanger includes an extension supply port 23 that is configured to removably couple to an extension liquid supply line 25 and extension return port 24 that is configured to removably couple to an extension vapor return line 26. As illustrated both the extension liquid supply line and the extension vapor return line are coupled to supply and return ports, respectively, of the heat exchanger 5b. This configuration enables for the second heat exchanging loop to be extended to include any number of heat exchangers (e.g., heat exchangers 5a and 5b).

During operation, (the second) vapor 28 produced by the condenser 6 travels from the condenser, through the vapor return line 14, and enters the (cooling coil 27a of the) heat exchanger 5a via the return port 22. The vapor travels up (and through) the cooling coil, which condenses at least some of the vapor back into the (second) liquid coolant 29. At least some vapor is also distributed to the (cooling coil 27b of the) heat exchanger 5b via the extension return port 24, the extension vapor return line 26, and a return port of the heat exchanger. At least one of the heat exchangers condense the vapor using their respective fans which are configured to move ambient air into an air inlet of the heat exchangers and over their corresponding cooling coils. For example, fans 19a move (e.g., may push) ambient air into an inlet of the heat exchanger 5a and the air draws heat from the vapor in the cooling coil 27a, causing the vapor to condense back into the second liquid coolant. The heat exchanger 5a expels hot exhaust air out of an air outlet, and condensed second liquid coolant travels back to the condenser via the liquid supply line 13. A similar operation occurs for each heat exchanger that is coupled to the first heat exchanger 5a. For example, heat exchanger 5b condenses the vapor back into the second liquid coolant, which then travels back to the condenser via a supply port, the extension liquid supply line 25, the extension supply port 23, and the (cooling coil of the) heat exchanger 5a.

In another embodiment, the controller 3 may be communicatively coupled to the fans and may be configured to control fan speed based on certain criteria. For example, the controller may increase the fan speed (e.g., by transmitting a control signal to the fans 19a) based on the ambient temperature. As another example, the controller may increase or decrease fan speed based on the time of day. For instance, the fans may have a higher fan speed during daytime than a fan speed during nighttime.

In one embodiment, heat exchangers may be added to the second heat exchanging loop based on the environment at which the cooling system 1 is deployed. For instance, the condensation rate of the heat exchangers 5a-5n is dependent upon the ambient air temperature. As a result, when the system is deployed within a hot or warm climate, the cooling surface area (e.g., the area of the cooling coils) must be increased in order to increase cooling capacity of the system. Thus, more heat exchangers may be deployed in hotter or warmer climates than in cooler climates. In one embodiment, since the heat exchangers may be removably coupled from the second heat exchanging loop, heat exchangers may be added/removed throughout the year in order to accommodate different climates between different seasons.

Figure 3:
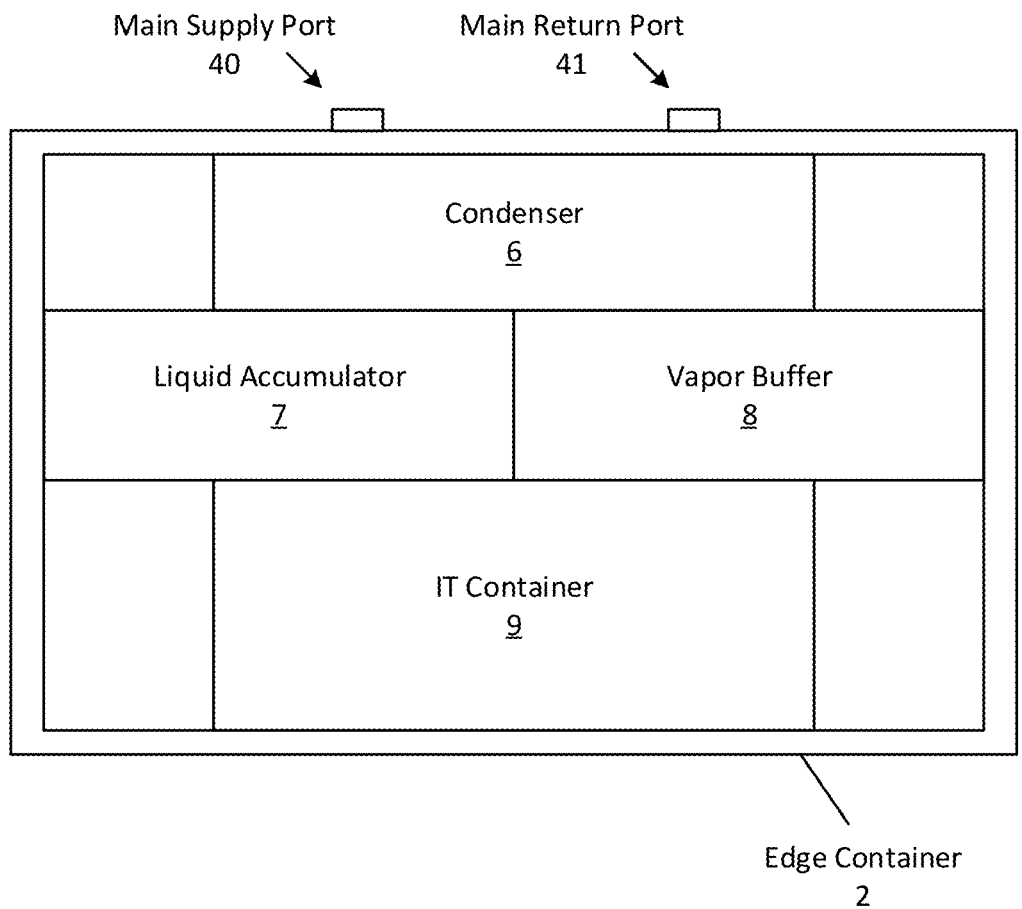
FIG. 3 is a block diagram illustrating an example of an edge container according to one embodiment.

FIG. 3 is a block diagram illustrating an example of an edge container according to one embodiment. As illustrated, the condenser 6, liquid accumulator 7, vapor buffer 8, and IT container 9 may each be fully enclosed (sealed) within the edge container 2 in order to protect the components from the ambient environment (e.g., air pollution, etc.). In one embodiment, the edge container may also include the main liquid supply line 11 and main vapor return line 12. In another embodiment, the components may be arranged as illustrated herein. For example, the condenser 6 is positioned above the IT container, while the liquid accumulator and the vapor buffer are between the condenser and IT container. The components may be arranged this way because the vapor rises from the IT container into either the condenser, vapor buffer, or a combination thereof. Once condensed, gravity helps the liquid coolant travel from the condenser back down to either the fluid accumulator, IT container, or a combination thereof. In one embodiment, the liquid accumulator and vapor buffer may be side to side (as illustrated) or may be stacked on top of one another (e.g., the liquid accumulator on top of the vapor buffer).

Also shown, the edge container includes a main supply port 40 and a main return port 41 that are both coupled to the condenser 6 and are both configured to removably couple to the heat exchanger 5a via the liquid supply line 13 and the vapor return line 14, respectively. Specifically, similar to the ports described in FIG. 2, ports 40 and 41 may include connectors, such as blind matting quick disconnects that enable the ports 40 and 41 to removably couple to the lines 13 and 14, respectively. For instance, as described herein, may be male type connectors that are configured to removably couple to female type connectors of the liquid supply and vapor return lines. In one embodiment, the Thus, the ports 40 and 41 enable the edge container to be transported as a single unit to a particular location, and then coupled to one or more heat exchangers.

Figure 4:
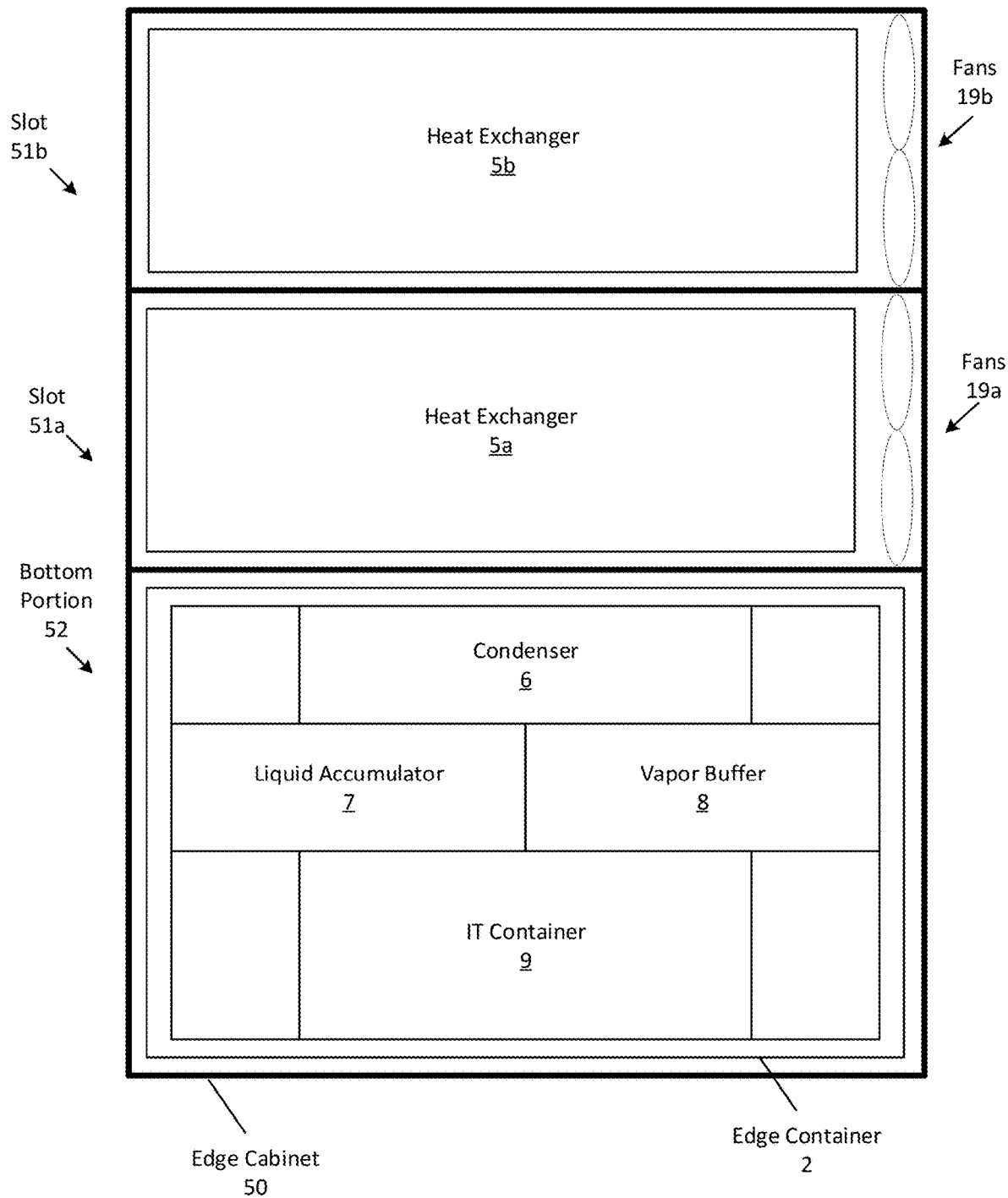
FIG. 4 is a block diagram illustrating an example of an edge cabinet according to one embodiment.

FIG. 4 is a block diagram illustrating an example of an edge cabinet 50 according to one embodiment. The edge cabinet 50 is a structure (or enclosure) that is configured to house the edge cooling system 1 of FIG. 1. Specifically, the edge cabinet includes a bottom portion 52 that is configured to house the edge cabinet 2 and at least one slot 51 that is configured to house one or more heat exchangers 5. In particular, this cabinet 50 includes two slots 51a and 51b, each slot housing one heat exchanger 51a and 51b, respectively. In addition, each of the slots includes the one or more fans 19a and 19b, respectively, integrated therein. In one embodiment, the edge cabinet may include additional components of the edge cooling system, such as the temperature sensor 4 and/or controller 3 as described herein. As another example, the cabinet 50 may include connections (e.g., supply and return lines) for the heat exchangers and/or the edge container as described herein.

In one embodiment, each of the components described herein may be assembled inside the edge cabinet in order to enable convenient and efficient transportation and deployment of the edge cooling system. In another embodiment, at least some of the components may be removably housed within the cabinet. For example, heat exchangers may be added/removed from the slots. Thus, each of the components may be transported separately to a particular location and then assembled during deployment. In another embodiment, the cabinet 50 may include additional environmental protection. For instance, the edge container may be sealed within the bottom portion in order to provide double protection to the components contained within the edge container 2.

FIG. 5 is a flow chart of a process 60 for determining what cooling mode an edge cooling system is to operate based on the ambient temperature according to one embodiment. This figure will be described with reference to edge cooling system 1 of FIG. 1. In particular, at least some of the operations of the process 60 may be performed by the controller 3 of the system 1. The process 60 begins by the controller 3 obtaining an ambient temperature reading (e.g., represented as an electrical signal produced) by the temperature sensor 4 (at block 61). The controller determines whether the ambient temperature is above a first temperature threshold (at decision block 62). In particular, the controller may compare the ambient temperature to a temperature value that may be based on one of several factors. For instance, the temperature value may be based on the components within the edge cooling system and/or the components operating temperature requirements (e.g., the edge device's 10 operating requirements). In one embodiment, the temperature valve may be based on the type of liquid coolant used within the first and/or second heat exchanging loops. In one embodiment, the temperature value may dynamically change (e.g., based on the components within the system). In another embodiment, the temperature value is a predetermined value (e.g., that is determined within a controlled setting, such as a laboratory). If so, the process 60 operates the edge cooling system in a supplemental cooling and vapor buffer mode in which the controller controls the opening positions of the valves 15a-15d to allow the system to use the liquid accumulator 7 and vapor buffer 8 for supplemental cooling and vapor buffering. In one embodiment, the first temperature threshold may represent a warm or hot ambient temperature (e.g., a temperature during daytime and/or during a warmer season such as spring or summer). With a warm or high ambient temperature, the condensation rate of the condenser 6 may be lower than the boiling rate of the liquid coolant 16. In other words, the IT container may be producing more vapor than the condenser can condense back into liquid coolant. As a result, the controller adjusts valves 15c and 15d to allow the vapor buffer to store at least some of the vapor produced by the IT container to reduce the amount of vapor being received by the condenser. Since the condenser has a lower condensation rate, it may not be condensing a sufficient amount of liquid coolant for the IT container. As a result, the controller adjusts the opening position of valve 15b to allow liquid coolant already stored within the liquid accumulator to supplement the reduced condensed liquid coolant. As a result, the edge cooling system may continue to operate even at high ambient temperatures (e.g., during hot summer days) due to the collection of vapor and supplemental liquid coolant.

If, however, the ambient temperature is not above the first threshold temperature the process 60 determines whether the ambient temperature is below a second temperature threshold that is lower than the first temperature threshold (at decision block 64). In one embodiment, the second temperature threshold may represent a cold ambient temperature (e.g., a temperature during nighttime and/or during a colder season such as fall or winter). If so, the process 60 operates the edge cooling system in recharge mode (at block 65). For example, in the previous mode, the system may operate for a significant amount of time (e.g., 10 hours) in which the liquid accumulator becomes depleted due to supplementing the liquid coolant being condensed by the condenser 6. As a result, when the temperature drops to a cooler temperature (e.g., during nighttime), the controller controls the opening positions of the valves in order to recharge or replenish the liquid accumulator. For instance, during this mode, the controller opens valves 15c and 15d in order to allow vapor produced by the IT container, as well as vapor that is buffered within the vapor buffer to be condensed by the condenser 6. The condenser is able to handle this additional vapor from the buffer due to the low ambient temperature. In addition, the controller opens valve 15a and closes valve 15b in order to allow condensed liquid coolant from the condenser to flow into both the IT container and liquid accumulator. As a result, the liquid accumulator may be replenished during times at which the ambient temperature is low. In one embodiment, the liquid accumulator may include a level gauge which when reaches a certain threshold, the controller may adjust valve 15a to only allow condensed liquid coolant to flow into the IT container in order to not overflow the liquid accumulator.

If, however, the ambient temperature is not below the second temperature threshold, the process 60 determines that the ambient temperature is between the first temperature threshold and the second temperature threshold (at block 66). As a result, the process 60 operates the edge cooling system in normal mode (at block 67). In this mode, the ambient temperature is not too high and is not too low. As a result, the system does not need the liquid accumulator to supplement the condensed liquid coolant from the condenser 6, nor does the system need the vapor buffer 8 to store excess vapor. Thus, the controller controls the valves to remove the liquid accumulator and the vapor buffer from the first heat exchanging loop (e.g., from being in parallel with their respective lines).

Some embodiments may perform variations to the process 60. For example, the specific operations of the process may not be performed in the exact order shown and described. The specific operations may not be performed in one continuous series of operations and different specific operations may be performed in different embodiments. For example, the process may switch between modes based on the operating conditions of the system 1. In particular, if the edge device 10 produces an excess amount of heat (e.g., during times at which the device performing a higher workload), the liquid coolant 16 stored within the IT container may vaporize at a faster rate. As a result, the controller 3 may switch to the supplemental mode, having the liquid accumulator 7 supplement the condenser 6, during times at which the edge device 10 is over performing (or during times at which the temperature of the IT container or the liquid coolant 16 is above a threshold). In one embodiment, if one or more of the fans (e.g., 19a) fails, the supplemental cooling mode may be used for a short period of time in order to allow the system to operate.

In one embodiment, the controller 3 may operate in a given mode for a predetermined amount of time and based on the operating needs of the edge cooling system 1. For example, the size (or capacity) of either the liquid accumulator 7 and the vapor buffer 8 may be designed in order for the system to operate in the supplemental mode for a given amount of time (e.g., ten hours). Thus, the system may be modified in order to accommodate the predetermined amount of time.

Figure 6A:
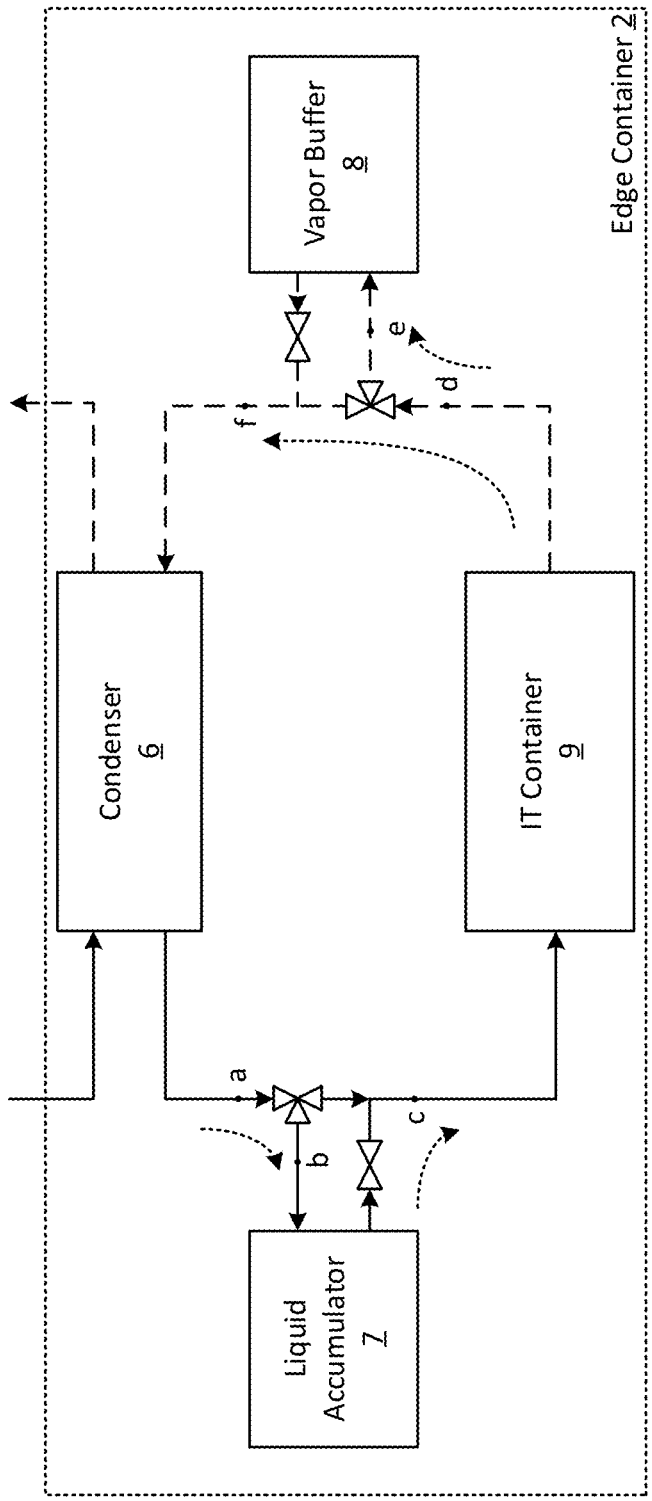
FIGS. 6A-6C are examples of how liquid coolant and vapor flows are designed and managed through an edge cooling system based on the ambient temperature according to one embodiment.
Figure 6B:
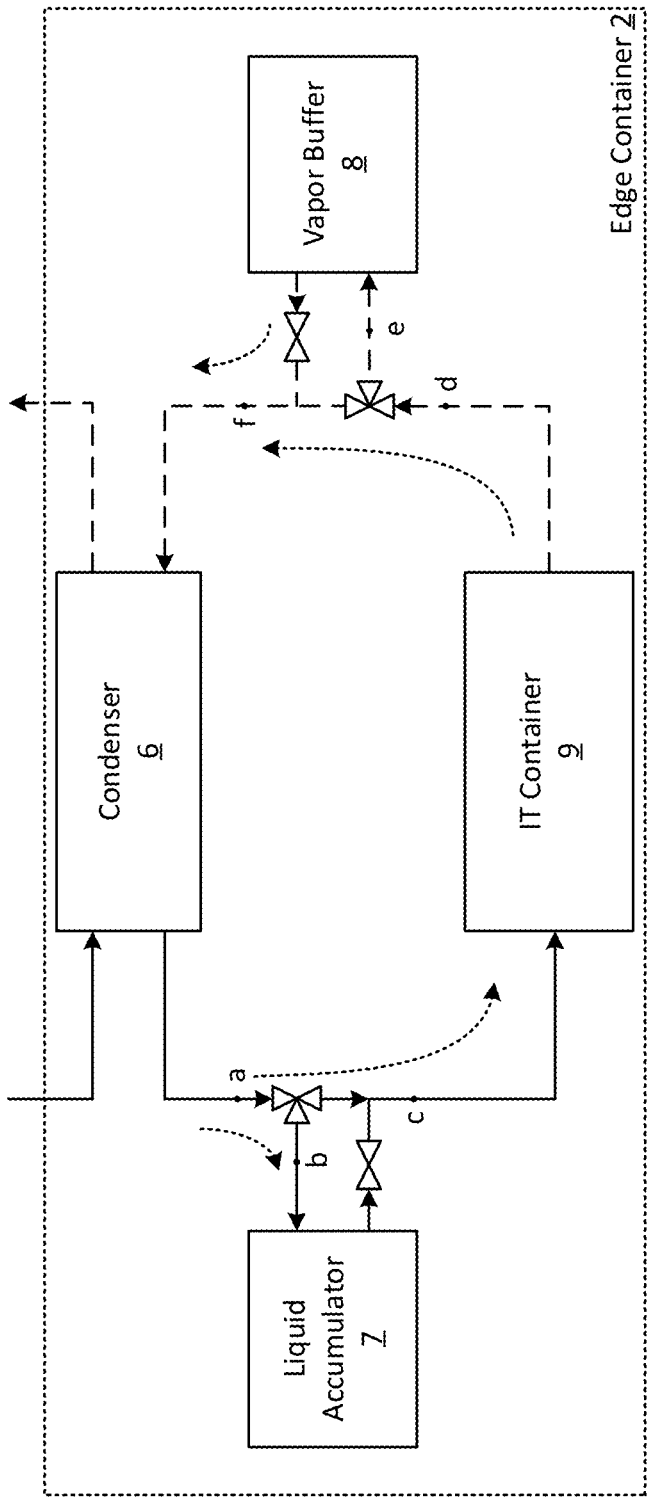
Figure 6C:
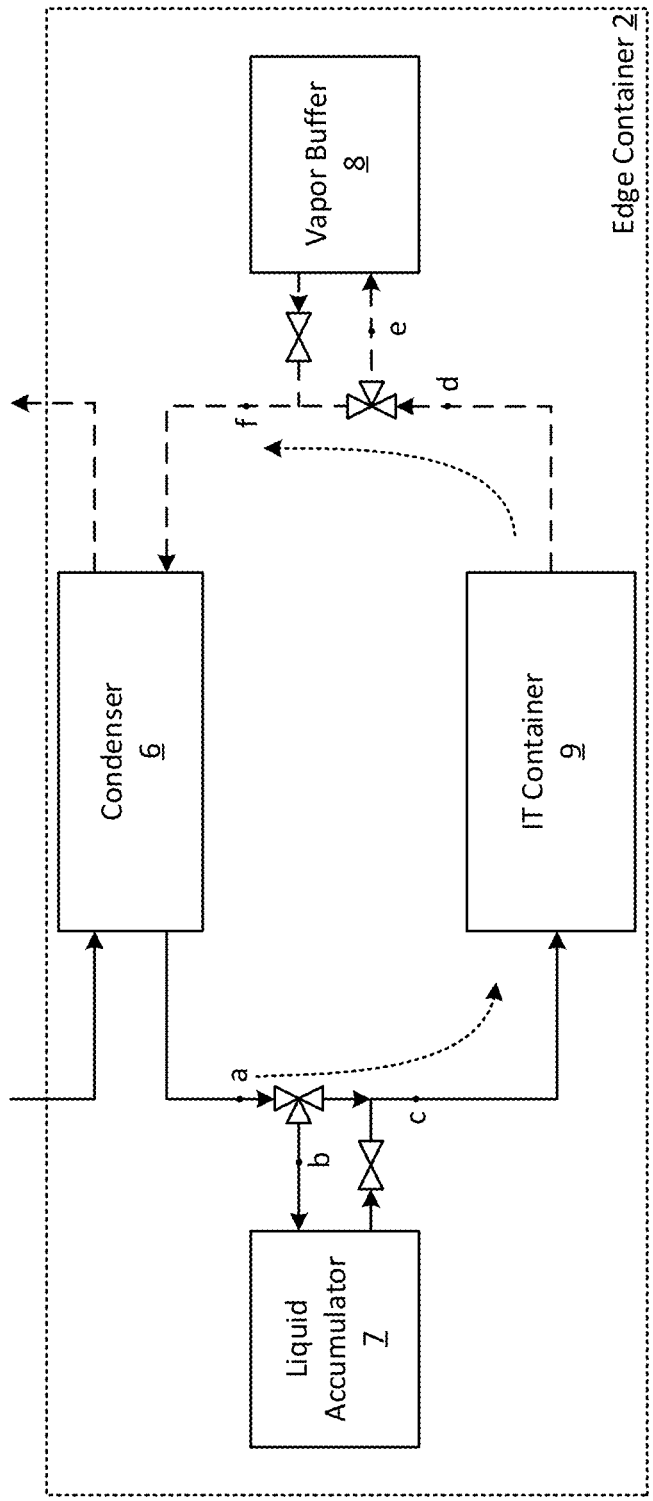

FIGS. 6A-6C are examples of operating modes of an edge cooling system based on the ambient temperature according to one embodiment. Specifically, FIG. 6A illustrates the edge cooling system 1 operating in supplemental cooling and vapor buffer mode. For instance, when the ambient temperature is above the first temperature threshold, the controller 3 is configured to 1) (partially) open valve 15a to only allow liquid coolant to flow from "a" to "b", 2) open valve 15b, 3) (fully) open valve 15c to allow vapor to flow from "d" to "f" and from "d" to "e", and 4) close valve 15d.

FIG. 6B illustrates the edge cooling system 1 operating in recharge mode. For instance, when the ambient temperature is below the second temperature threshold, the controller is configured to 1) (fully) open valve 15a to allow liquid coolant to flow from "a" to "b" and from "a" to "c", 2) close valve 15b, 3) (partially) open valve 15c to only allow vapor to flow from "d" to "f", and 4) open valve 15d.

FIG. 6C illustrates the edge cooling system operating in normal mode. For instance, when the ambient temperature is between the first and second temperature thresholds, the controller is configured to 1) (partially) open valve 15a to only allow liquid coolant to flow from "a" to "c", 2) close valve 15b, 3) (partially) open valve 15c to only allow vapor to flow from "d" to "f", and 4) close valve 15d.

In one embodiment, the controller 3 may adjust the opening ratios of one or more valves as described herein. For instance, during the recharge mode the controller may control valve 15a to have two different opening ratios. For example, the valve may have a low opening ratio (e.g., 30%) between "a" and "c", while the valve may have a high opening ratio (e.g., 100%) between "a" and "b". The opening ratios may be adjusted in order to allow the controller to fill the liquid accumulator at a fast rate. In another embodiment, the controller may always apply a 100% opening ratio (or fully open) valves when setting the valves to open.

As previously explained, an embodiment of the disclosure may be (or include) a non-transitory machine-readable medium (such as microelectronic memory) having stored thereon instructions, which program one or more data processing components (generically referred to here as a "processor") to perform valve control operations, such as determining which cooling mode to operate the edge cooling system based on the ambient temperature, and in response controlling one or more valves, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An edge cooling system, comprising:
   an Information Technology (IT) container having an edge device that is configured to provide IT services and is at least partially submerged within a liquid coolant, wherein, while the edge device provides the IT services, the edge device generates heat that is transferred into the liquid coolant thereby causing at least some of the liquid coolant to turn into a vapor;
   a condenser that is configured to condense vapor back into liquid coolant;
   a vapor buffer that is configured to at least one of buffer the vapor or provide buffered vapor to the condenser;
   a liquid accumulator that is configured to at least one of accumulate the liquid coolant condensed by the condenser or provide the accumulated liquid coolant to the IT container;
   a main liquid supply line that couples the condenser and the IT container to the liquid accumulator and a main vapor return line that couples the condenser and the IT container to the vapor buffer to create a heat exchanging loop; and
   an edge container in which the IT container, the vapor buffer, the condenser, the liquid accumulator, the main liquid supply line, and the main vapor return line are fully enclosed therein.

2. The edge cooling system of claim 1,
   wherein the heat exchanging loop is a first heat exchanging loop, the liquid coolant is a first liquid coolant, and the vapor is a first vapor,
   wherein the edge cooling system further comprises a heat exchanger that is coupled to the condenser via a liquid supply line and a vapor return line to create a second heat exchanging loop in which 1) the liquid supply line is configured to provide a second liquid coolant from the heat exchanger to the condenser and 2) the vapor return line is configured to provide a second vapor from the condenser to the heat exchanger that is produced when the condenser transfers heat contained within the vapor in the first heat exchanging loop into the second liquid coolant,
   wherein the heat exchanger comprises
      a cooling coil that is configured to condense the second vapor into the second liquid coolant, and
      at least one fan that is configured to move ambient air over the cooling coil.

3. The edge cooling system of claim 2, wherein the edge container comprises a main supply port and a main return port that are both coupled to the condenser, wherein the main supply port and the main return port each have a dripless quick disconnect that is configured to removably couple to the liquid supply line and vapor return line, respectively.

4. The edge cooling system of claim 2, wherein the heat exchanger is a first heat exchanger that includes 1) a supply port and a return port that are each configured to removably couple to the liquid supply line and vapor return line, respectively and 2) an extension supply port and an extension return port that are both configured to removably couple to a second heat exchanger via an extension liquid supply line and an extension vapor return line, respectively, to extend the second heat exchanging loop to include both the first and second heat exchangers.

5. The edge cooling system of claim 2, wherein the heat exchanger and the edge container are one integrated unit.

6. The edge cooling system of claim 1,
   wherein the main liquid supply line includes a first three-way valve that is coupled between the condenser, the liquid accumulator, and the IT container and a first two-way valve that is coupled between the liquid accumulator and the IT container,
   wherein the main vapor return line includes a second three-way valve that is coupled between the IT container, the vapor buffer, and the condenser and a second two-way valve that is coupled between the vapor buffer and the condenser.

7. The edge cooling system of claim 6, further comprising
   a temperature sensor that is configured to sense an ambient temperature and produce a signal that represents the ambient temperature; and
   a controller that is communicatively coupled to the temperature sensor and is configured to control an opening ratio of the first three-way valve, the first two-way valve, the second three-way valve, and the second two-way valve based on the ambient temperature.

8. The edge cooling system of claim 7, wherein, when the ambient temperature is above a temperature threshold, the controller is configured to 1) open the first three-way valve to only allow liquid coolant to flow from the condenser into the liquid accumulator, 2) open the first two-way valve to allow liquid coolant to flow from the liquid accumulator into the IT container, 3) open the second three-way valve to allow vapor to travel from the IT container into the vapor buffer and the condenser, and 4) close the second two-way valve.

9. The cooling system of claim 8, wherein the temperature threshold is a first temperature threshold, wherein, when the ambient temperature is below a second temperature threshold that is lower than the first temperature threshold, the controller is configured to 1) open the first three-way valve to allow liquid coolant to flow from the condenser into the liquid accumulator and the IT container, 2) close the first two-way valve, 3) open the second three-way valve to only allow vapor to travel from the IT container into the condenser, and 4) open the second two-way valve to allow vapor to travel from the vapor buffer into the condenser.

10. The edge cooling system of claim 9, wherein, when the ambient temperature is between the first and second temperature thresholds, the controller is configured to 1) open the first three-way valve to only allow liquid coolant to flow from the condenser into the IT container, 2) close the first two-way valve, 3) open the second three-way valve to only allow vapor to travel from the IT container into the condenser, and 4) close the second two-way valve.

11. An edge cabinet comprising:
an edge container that has enclosed therein
an Information Technology (IT) container having an edge device that is configured to provide IT services and is at least partially submerged within a liquid coolant, wherein, while the edge device provides the IT services, the edge device generates heat that is transferred into the liquid coolant thereby causing at least some of the liquid coolant to turn into a vapor;
a condenser that is configured to condense vapor back into liquid coolant;
a vapor buffer that is configured to at least one of buffer the vapor or provide buffered vapor to the condenser;
a liquid accumulator that is configured to at least one of accumulate the liquid coolant condensed by the condenser or provide the accumulated liquid coolant to the IT container; and
a main liquid supply line that couples the condenser and the IT container to the liquid accumulator and a main vapor return line that couples the condenser and the IT container to the vapor buffer to create a heat exchanging loop.

12. The edge cabinet of claim 11, wherein the heat exchanging loop is a first heat exchanging loop, wherein the edge cabinet further comprises one or more slots that are each configured to house at least one heat exchanger that is configured to couple to the condenser via a liquid supply line and a vapor return line to create a second heat exchanging loop.

13. The edge cabinet of claim 12, wherein the edge container comprises a main supply port and a main return port that are both coupled to the condenser, wherein the main supply port and the main return port each have a dripless quick disconnect that is configured to removably couple to the liquid supply line and the vapor return line, respectively.

14. The edge cabinet of claim 12, wherein the liquid coolant is a first liquid coolant and the vapor is a first vapor, wherein the liquid supply line is configured to provide a second liquid coolant from the heat exchanger to the condenser and the vapor return line is configured to provide a second vapor from the condenser to the heat exchanger that is produced when the condenser transfers heat contained within the vapor in the first heat exchanging loop into the second liquid coolant, wherein the at least one heat exchanger comprises
a cooling coil that is configured to condense the second vapor into the second liquid coolant, and
one or more fans that is configured to move ambient air over the cooling coil.

15. The edge cabinet of claim 12, wherein the at least one heat exchanger is a first heat exchanger that includes 1) a supply port and a return port that are each configured to removably couple to the liquid supply line and the vapor return line, respectively and 2) an extension supply port and an extension return port that are both configured to removably couple to a second heat exchanger via an extension liquid supply line and an extension vapor return line, respectively, to extend the second heat exchanging loop to include both the first and second heat exchangers.

16. The edge cabinet of claim 11,
wherein the main liquid supply line includes a first three-way valve that is coupled between the condenser, the liquid accumulator, and the IT container and a first two-way valve that is coupled between the liquid accumulator and the IT container,
wherein the main vapor return line includes a second three-way valve that is coupled between the IT container, the vapor buffer, and the condenser and a second two-way valve that is coupled between the vapor buffer and the condenser.

17. The edge cabinet of claim 16, further comprising
a temperature sensor that is configured to sense an ambient temperature and produce a signal that represents the ambient temperature; and
a controller that is communicatively coupled to the temperature sensor and is configured to control an opening ratio of the first three-way valve, the first two-way valve, the second three-way valve, and the second two-way valve based on the ambient temperature.

18. The edge cabinet of claim 17, wherein, when the ambient temperature is above a temperature threshold, the controller is configured to 1) open the first three-way valve to only allow liquid coolant to flow from the condenser into the liquid accumulator, 2) open the first two-way valve to allow liquid coolant to flow from the liquid accumulator into the IT container, 3) open the second three-way valve to allow vapor to travel from the IT container into the vapor buffer and the condenser, and 4) close the second two-way valve.

19. The edge cabinet of claim 18, wherein the temperature threshold is a first temperature threshold, wherein, when the ambient temperature is below a second temperature threshold that is lower than the first temperature threshold, the controller is configured to 1) open the first three-way valve to allow liquid coolant to flow from the condenser into the liquid accumulator and the IT container, 2) close the first two-way valve, 3) open the second three-way valve to only allow vapor to travel from the IT container into the condenser, and 4) open the second two-way valve to allow vapor to travel from the vapor buffer into the condenser.

20. The edge cabinet of claim 19, wherein, when the ambient temperature is between the first and second temperature thresholds, the controller is configured to 1) open the first three-way valve to only allow liquid coolant to flow from the condenser into the IT container, 2) close the first two-way valve, 3) open the second three-way valve to only allow vapor to travel from the IT container into the condenser, and 4) close the second two-way valve.

* * * * *